United States Patent [19]

Kasperkovitz

[11] Patent Number: 4,554,503

[45] Date of Patent: Nov. 19, 1985

[54] CURRENT STABILIZING CIRCUIT ARRANGEMENT

[75] Inventor: Wolfdietrich G. Kasperkovitz, Eindhoven, Netherlands

[73] Assignee: U.S. Philips Corporation, New York, N.Y.

[21] Appl. No.: 574,774

[22] Filed: Jan. 27, 1984

[30] Foreign Application Priority Data

Feb. 10, 1983 [NL] Netherlands ........................ 8300499

[51] Int. Cl.[4] ........................ G05F 3/20; H03K 17/00

[52] U.S. Cl. .................................... 323/315; 323/907; 330/288

[58] Field of Search ................ 307/296, 297; 323/312, 323/315, 907; 330/288

[56] References Cited

U.S. PATENT DOCUMENTS 3,781,648 12/1973 Owens .................................... 324/4
3,831,040 8/1974 Nanba et al. ........................ 307/296
3,962,592 6/1976 Thommen et al. ................. 307/297
4,063,149 12/1977 Crowle ................................ 323/315
4,287,467 9/1981 Gloaguen ............................ 323/314
4,362,984 12/1982 Holland ............................... 323/313
4,362,985 12/1982 Tsuchiya ............................. 323/314

*Primary Examiner*—Peter S. Wong
*Assistant Examiner*—D. L. Rebsch
*Attorney, Agent, or Firm*—Robert T. Mayer; Steven R. Biren

[57] ABSTRACT

A current stabilizing arrangement includes a first circuit having a series arrangement of a first resistor, a second resistor, and the collector-emitter path of a first transistor having its base connected to a point between the first and second resistors. A second circuit includes the collector-emitter path of a second transistor whose base is coupled to the collector of the first transistor. By providing a third resistor in the first circuit, in series with the first and second resistors and connected between the base of the second transistor and the collector of the first transistor, improved current stabilization with variations in supply voltage is obtained.

2 Claims, 4 Drawing Figures

CURRENT STABILIZING CIRCUIT ARRANGEMENT

BACKGROUND OF THE INVENTION

The invention relates to a current stabilizing arrangement comprising a first circuit between a first and a second power-supply terminal which comprises a series arrangement of a first resistor, a second resistor, and the collector emitter path of a first transistor whose base is connected to a point between the first and the second resistor, and a second circuit between a third terminal and the second power-supply terminal which comprises the collector-emitter path of a second transistor of the same conductivity type as the first transistor, whose base is coupled to the collector of the first transistor.

Such an arangement is suitable for general use in integrated circuits. In particular, such a circuit arrangement may be used in a one-chip integrated radio receiver.

Such a circuit arrangement is known from U.S. Pat. No. 3,831,040. In this arrangement the current in the first circuit is the unstabilized current and the current in the second circuit is the stabilized current. Stabilization is achieved by having the current in the first circuit, which can be adjusted by means of the first resistor, produce a substantially constant voltage across the first transistor which is arranged as a diode. In order to ensure that the current in the second circuit is also stabilized with respect to supply-voltage variations, a second resistor is arranged between the base and the collector of the first transistor, the base of the second transistor being connected to the collector of the first transistor. In the case of a supply-voltage variation, the voltage variation across the first transistor which is arranged as a diode is substantially equal to the voltage variation across the differential resistance of the diode. In order to make the current in the second circuit independent of these last-mentioned voltage variations, the voltage across the differential resistance is compensated for by the voltage across the second resistor.

However, the differential resistance of a diode is inversely proportional to the current through the diode. For a specific value of the second resistor this means that the voltage variation across the second resistor is equal to the voltage variation across the differential resistance for only one specific current and, consequently, one specific supply voltage. The current in the second circuit is therefore independent of supply-voltage variations only to a limited extent. In the case of a suitable value of the second resistor, the known circuit arrangement enables the current in the second circuit to be stabilized to within 5% in the voltage range of approximately 2 to 10 V, which is the customary range for integrated circuits.

SUMMARY OF THE INVENTION

It is the object of the invention to provide a current stabilizing arrangement which is more independent of supply-voltage variations. A current stabilizing arrangement of a type as set forth in the opening paragraph is characterized in that in the first circuit, in series with the first and the second resistor, a third resistor is arranged between the connection point of the base of the second transistor and the collector of the first transistor. The third resistor limits the voltage variation across the second resistor to a maximum value which is determined by the ratio between the resistance values of the second and the third resistors. The third resistor can now ensure that the voltage variation across the second resistor is substantially equal to the voltage variation across the differential resistance over a large voltage range. A current stabilizing arrangement in accordance with the invention is characterized in that in the first circuit, in series with the collector-emitter path of the first transistor, the collector-emitter path of a third transistor is arranged, whose base is coupled to its collector, and in the second circuit a fourth resistor is arranged between the emitter of the second transistor and the second power-supply terminal.

BRIEF DESCRIPTION OF THE DRAWING

The invention will now be described in more detail, by way of example, with reference to the accompanying drawing, in which.

DESCRIPTION OF THE PREFERRED EMBODIMENTS

Figure 1A:
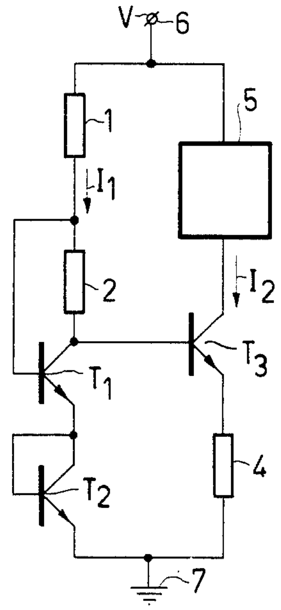
FIG.1a PRIOR ART
FIG. 1*a* shows a known type of current stabilizing arrangement.
Figure 1B:
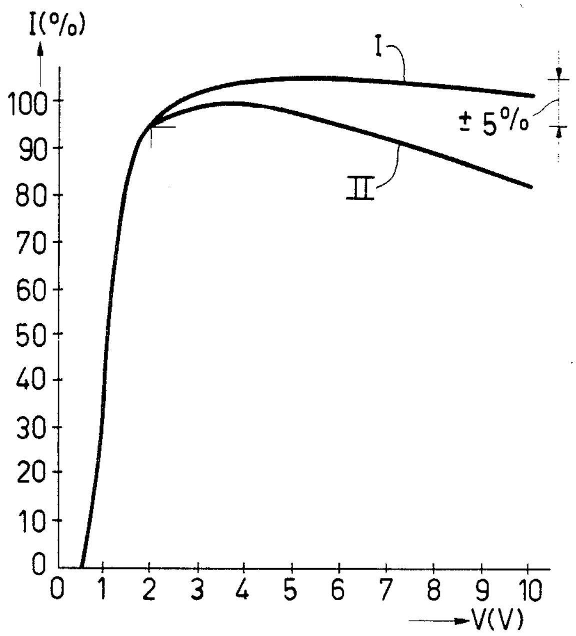
FIG.1b PRIOR ART
FIG. 1*b* shows current-voltage characteristics of the current stabilizing arrangement shown in FIG. 1*a;*

FIG. 1*a* shows a known type of current stabilizing arrangement using the arrangement described in the aforementioned U.S. Pat. No. 3,831,040. Between two power-supply terminals 6 and 7 the circuit arrangement includes a first circuit which comprises the series arrangement of a first resistor 1, a second resistor 2, the collector emitter path of a first transistor $T_1$ whose base is coupled to a point between the first resistor 1 and the second resistor 2, and the collector-emitter path of a second transistor $T_2$ which is arranged as a diode. Between the power-supply terminals 6 and 7 the circuit arrangement further comprises a second circuit which comprises a load 5, which is shown schematically, the collector-emitter path of a third transistor $T_3$ whose base is coupled to the collector of transistor $T_1$, and a resistor 4. The current $I_2$ in the second circuit is substantially equal to $I_2 = V_{BE}/R_4$, $V_{BE}$ being the base-emitter voltage of transistor $T_3$ arranged as a diode and $R_4$ being the value of the resistor 4. In order to ensure that the current $I_2$ supplied to the load 5 by the transistor $T_3$ is constant, the voltage on the base of transistor $T_3$ must be constant. The current $I_1$ through the first circuit is adjusted by means of the resistor 1. The voltage $V_{B3}$ on the base of transistor $T_3$ is approximately determined by the formula:

$$V_{B3} = 2V_{BE} + 2I_1 r_0 - I_1 R_2$$

in which $V_{BE}$ is the base-emitter voltage of the transistors $T_1$ and $T_2$, $r_0$ is the differential resistance of the transistors $T_1$ and $T_2$ which are arranged as diodes, and $R_2$ is the resistance value of the resistor 2. In the case of supply-voltage variations, the current $I_1$ also varies. The base-emitter voltage $V_{BE}$ of the transistors then remains substantially constant. It follows from the above formula that the base voltage $V_{B3}$, and consequently the current $I_2$, is constant if the voltage variation across the resistor 2 is equal to the voltage variation across the differential resistances, or if $R_2 = 2r_0$. As is known, the differential resistance of a diode is equal to $r_0=kT/qI_1$, where k is Boltzmann's constant, T the absolute temperature and q the electron charge. For values of $R_1$ which are not too small relative to $r_0$ the approximation $I_1=V/R_1$ is valid, which yields $r_0=kTR_1/qV$. This means that for a specific value of $R_2$ the voltage variation across the differential resistances $r_0$ is compensated for by the voltage variation across the resistor $R_2$ over only a limited range of supply voltages. Therefore, the current $I_2$ is independent of supply-voltage variations only to a limited extent. For a specific value of $R_1$ the supply-voltage range within which the current $I_2$ is substantially independent of supply-voltage variations depends on the value $R_2$ of the resistor 2. This will be explained with reference to FIG. 1*b*, which shows two current-voltage characteristics, the current $I_2$ in percent being plotted versus the supply voltage V. For the characteristic I the variation of the current $I_2$ is minimal over an as large as possible supply-voltage range. For this purpose the value of $R_2$ is selected so that the voltage drop across $R_2$ is substantially equal to the voltage drop across the differential resistances 2 $r_0$, which have a value corresponding to substantially the center of the voltage range over which the current $I_2$ is to be stabilized. Therefore, the characteristic I substantially complies with:

$$R_2/R_1=2KT/qV \text{ with } V\approx 6 \text{ Volt}$$

The variation of $I_2$ over the range from approximately 2 to 10 V is then approximately 5%. If the ratio $R_2/R_1$ is increased, stabilization is effected at lower voltages and over a smaller voltage range. For characteristic II, stabilization is effected for voltages between approximately 2 and 5 V. For higher voltages, the voltage variation across $R_2$ is substantially higher than the voltage variation across the resistances 2 $r_0$, which leads to overcompensation so that the variation of the current $I_2$ in the voltage range from approximately 2 to 10 V is substantially greater than 5%.

Figure 2A:
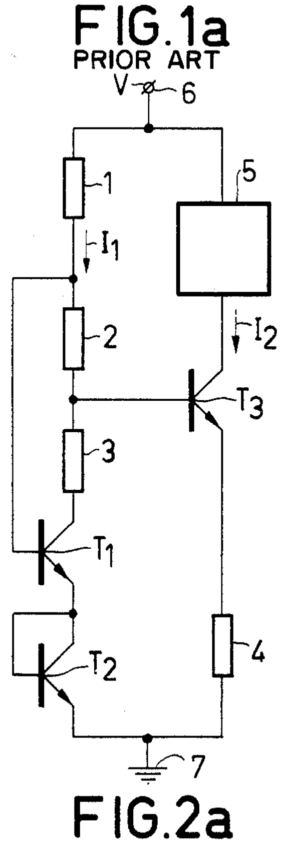
FIG. 2*a* shows a current stabilizing arrangement in accordance with the invention.
Figure 2B:
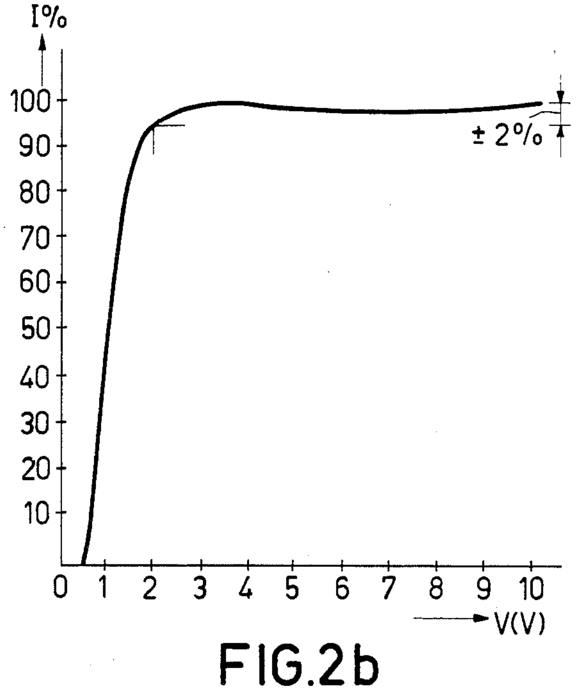
FIG. 2*b* shows a current-voltage characteristic of the current stabilizing arrangement shown in FIG. 2*a*.

FIG. 2*a* shows an embodiment of a current stabilizing arrangement in accordance with the invention. Identical parts bear the same reference numerals as in FIG. 1*a*. The current stabilizing arrangement differs from the arrangement shown in FIG. 1*a* in that in series with the resistors 1 and 2 a third resistor 3 is arranged between the base connection of transistor $T_3$ and the collector of transistor $T_1$. The resistor 3 limits the voltage variation across the resistor 2. It is found that the resistor 3 limits the compensation voltage for the voltage variation across the differential resistances to a maximum value of substantially $V_{BE}$. $R_2/R_3$, $R_3$, being the value of the resistor 3. This precludes overcompensation. By the addition of a resistor 3 of a suitably selected resistance value $R_3$ a stability improvement of a factor of 2.5 can be obtained in comparison with the stabilizing arrangement shown in FIG. 1*a*. FIG. 2*b* shows a current-voltage characteristic for the circuit arrangement shown in FIG. 2*a*. The variation of $I_2$ over the range of approximately 2 to 10 V is now ±2%.

In addition to the embodiment shown, the invention may be utilized in current stabilizing arrangements comprising one instead of two transistors in the first circuit and with or without a resistor in the emitter line of the transistor in the second circuit. Instead of NPN-transistors the current stabilizing arrangements in accordance with the invention may be equipped with PNP-transistors.

What is claimed is:

1. A current stabilizing arrangement comprising a first circuit between a first and a second power supply terminal which comprises a series arrangement of a first resistor, a second resistor and the collector-emitter path of a first transistor whose base is connected to a point between the first and the second resistor, and a second circuit between a third terminal and the second power supply terminal which comprises the collector-emitter path of a second transistor whose base is coupled to the collector of the first transistor, characterized in that in the first circuit, in series with the first and the second resistor, a third resistor is provided between the connection point of the base of the second transistor and the collector of the first transistor.

2. A current stabilizing arrangement as claimed in claim 1, characterized in that in the first circuit, in series with the collector-emitter path of the first transistor, the collector-emitter path of a third transistor is provided, the base of said third transistor being coupled to its collector, and in the second circuit a fourth resistor is provided between the emitter of the second transistor and the second power-supply terminal.

* * * * *